(12) United States Patent
Kajita

(10) Patent No.: US 10,914,995 B2
(45) Date of Patent: Feb. 9, 2021

(54) LIQUID CRYSTAL DISPLAY PANEL

(71) Applicants: Panasonic Liquid Crystal Display Co., Ltd., Himeji (JP); Pasona Knowledge Partner Inc., Osaka (JP)

(72) Inventor: Daisuke Kajita, Hyogo (JP)

(73) Assignees: PANASONIC LIQUID CRYSTAL DISPLAY CO., LTD., Hyogo (JP); PASONA KNOWLEDGE PARTNER INC., Osaka (JP)

( * ) Notice: Subject to any disclaimer, the term of this patent is extended or adjusted under 35 U.S.C. 154(b) by 24 days.

(21) Appl. No.: 16/157,942

(22) Filed: Oct. 11, 2018

(65) Prior Publication Data

US 2019/0163025 A1  May 30, 2019

(30) Foreign Application Priority Data

Nov. 29, 2017  (JP) .................................. 2017-229451

(51) Int. Cl.
| | | |
|---|---|---|
| H01L 27/12 | (2006.01) | |
| H01L 29/786 | (2006.01) | |
| G02F 1/136 | (2006.01) | |
| G02F 1/133 | (2006.01) | |
| G09G 3/36 | (2006.01) | |

(Continued)

(52) U.S. Cl.
CPC ...... *G02F 1/136209* (2013.01); *G02F 1/1368* (2013.01); *G02F 1/133345* (2013.01); *G02F 1/136286* (2013.01); *H01L 27/124* (2013.01); *H01L 27/1222* (2013.01); *H01L 27/1248* (2013.01); *H01L 29/78633* (2013.01); *H01L 29/78669* (2013.01); *G02F 2202/103* (2013.01);

(Continued)

(58) Field of Classification Search
CPC ................................................ H01L 29/78633
See application file for complete search history.

(56) References Cited

U.S. PATENT DOCUMENTS

2005/0036091 A1 * 2/2005 Song .................... H01L 27/124
349/129
2006/0131580 A1 6/2006 Yang et al.
(Continued)

FOREIGN PATENT DOCUMENTS

| JP | H4-132263 | 5/1992 |
| JP | 2006-171673 | 6/2006 |

(Continued)

*Primary Examiner* — Moazzam Hossain
*Assistant Examiner* — Omar F Mojaddedi
(74) *Attorney, Agent, or Firm* — Hamre, Schumann, Mueller & Larson, P.C.

(57) ABSTRACT

A liquid crystal display panel includes: thin film transistors provided in corresponding one of pixels and including a gate electrode, a source electrode, a drain electrode, and a semiconductor layer; a scanning line formed in a layer identical to that of the gate electrode and electrically connected to the gate electrode; and a first light shielding body formed in a layer identical to that of at least one of the source electrode and the drain electrode. The semiconductor layer is formed above the scanning line with an insulating layer interposed between the semiconductor layer and the scanning line, the first light shielding body is located above the scanning line and beside the semiconductor layer, and the first light shielding body and the scanning line are connected to each other through a contact hole made in the insulating layer.

14 Claims, 12 Drawing Sheets

(51) Int. Cl.
  *G02F 1/1362* (2006.01)
  *G02F 1/1368* (2006.01)
  *G02F 1/1333* (2006.01)

(52) U.S. Cl.
  CPC ......... *G09G 3/3677* (2013.01); *G09G 3/3688* (2013.01)

(56) References Cited

U.S. PATENT DOCUMENTS

2006/0243979 A1    11/2006  Park et al.
2012/0168756 A1*    7/2012  Ryu .................. H01L 29/41733
                                                  257/59
2015/0041765 A1*    2/2015  Ahn .................... H01L 51/5268
                                                  257/40
2019/0081120 A1*    3/2019  Zhang ................ H01L 27/3262
2020/0027958 A1*    1/2020  Suzuki ............... H01L 29/7869

FOREIGN PATENT DOCUMENTS

JP       2006-313906      11/2006
JP       2009-271390      11/2009
JP       2015-114375       6/2015

* cited by examiner

LIQUID CRYSTAL DISPLAY PANEL

CROSS-REFERENCE TO RELATED APPLICATION

This application claims priority from Japanese application JP 2017-229451, filed on Nov. 29, 2017. This Japanese application is incorporated herein by reference.

TECHNICAL FIELD

The present invention relates to a liquid crystal display device.

BACKGROUND

A liquid crystal display device in which the liquid crystal display panel is used can display an image with low power consumption, so that the liquid crystal display device is used as an image display device such as a television and a monitor.

The liquid crystal display panel includes a Thin Film Transistor (TFT) substrate on which a pixel electrode and a TFT are formed, a counter substrate opposed to the TFT substrate, and a liquid crystal layer disposed between the TFT substrate and the counter substrate. In the liquid crystal display panel, the image is displayed by controlling light transmittance of the liquid crystal layer in each pixel using a pixel electrode provided in each pixel (see, for example, Unexamined Japanese Patent Publication No. 2015-114375).

SUMMARY

In the liquid crystal display device, sometimes stray light enters a semiconductor layer of the thin film transistor. When the light is incident on the semiconductor layer of the thin film transistor, a TFT characteristic is changed to degrade image quality of the liquid crystal display device.

The present disclosure has been made to solve such problems, and the present disclosure provides a liquid crystal display panel having the excellent image quality.

To solve above problem, a liquid crystal display panel according to the present disclosure which has a plurality of pixels arranged in a matrix, includes: a thin film transistor provided in one of the plurality of pixels and including a gate electrode, a source electrode, a drain electrode, and a semiconductor layer; a scanning line formed in a layer identical to that of the gate electrode and electrically connected to the gate electrode; and a first light shielding body formed in a layer identical to that of at least one of the source electrode and the drain electrode. The semiconductor layer is formed above the scanning line with an insulating layer interposed between the semiconductor layer and the scanning line, the first light shielding body is located above the scanning line and beside the semiconductor layer, and the first light shielding body and the scanning line are connected to each other through a contact hole made in the insulating layer.

DETAILED DESCRIPTION

The following describes an exemplary embodiment of the present disclosure. The embodiment described below is merely one specific example of the present disclosure. The numerical values, shapes, materials, elements, and arrangement and connection of the elements, etc. indicated in the following embodiment are given merely by way of illustration and are not intended to limit the present disclosure. Therefore, among elements in the following embodiment, those not recited in any one of the independent claims defining the broadest inventive concept of the present disclosure are described as optional elements.

Note that the figures are schematic illustrations and are not necessarily precise depictions. Accordingly, the figures are not necessarily to scale. Moreover, in the figures, elements that are essentially the same share like reference signs. Accordingly, duplicate description is omitted or simplified.

Figure 1:
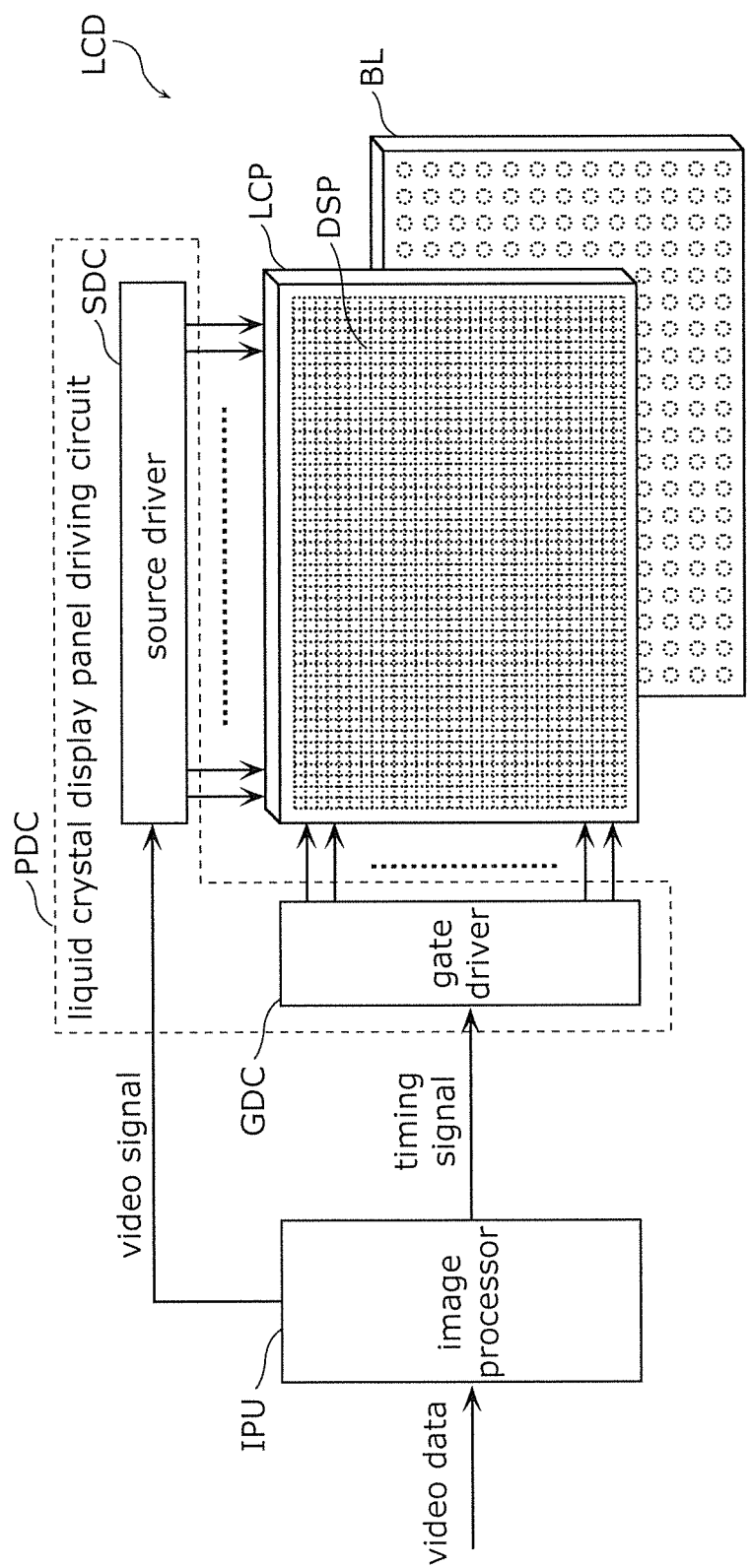
FIG. 1 is a view illustrating a schematic configuration of a liquid crystal display device according to a first exemplary embodiment.
Figure 2:
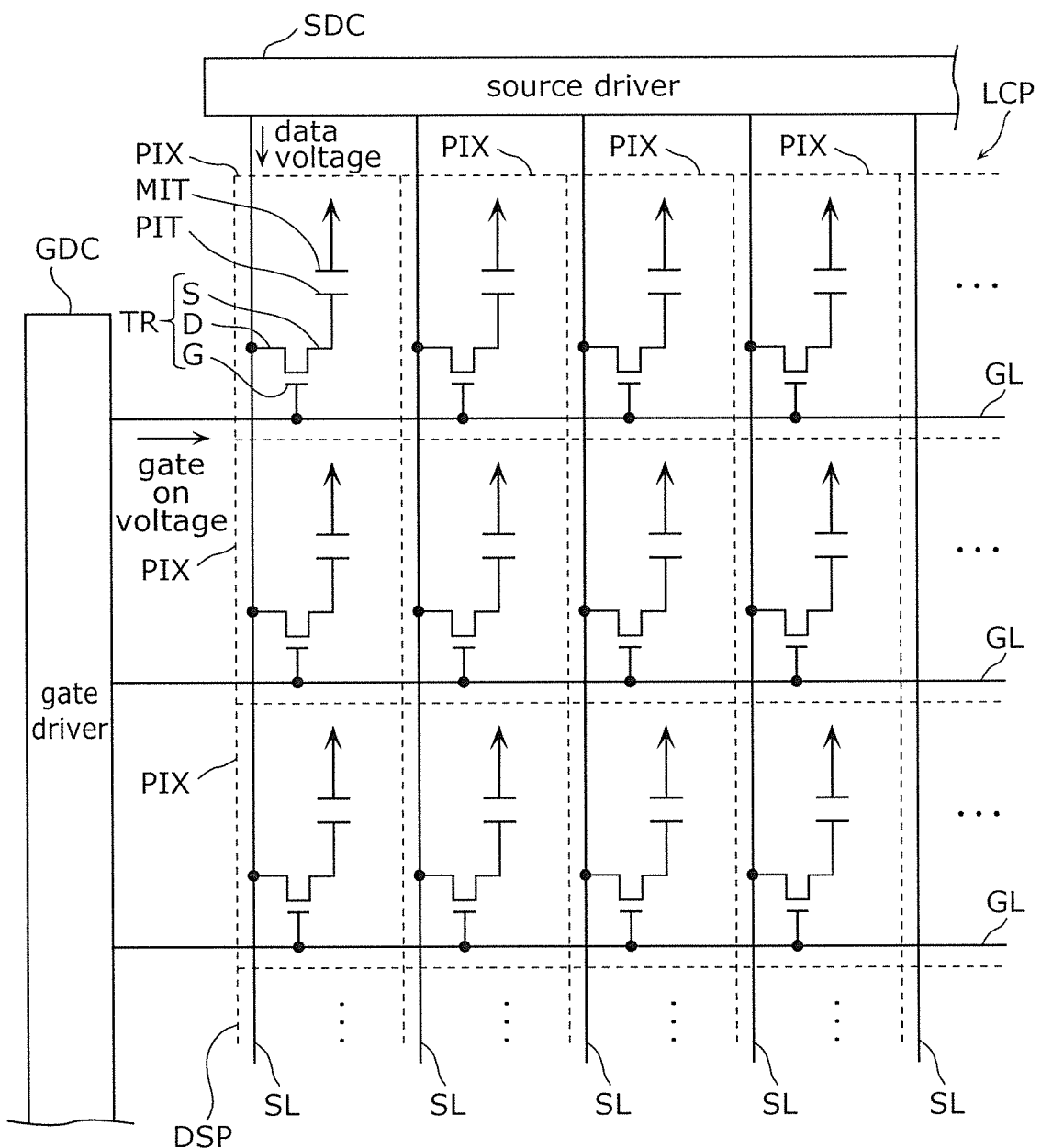
FIG. 2 is a view illustrating a pixel circuit of the liquid crystal display panel of the first exemplary embodiment.

FIG. 1 is a view illustrating a schematic configuration of a liquid crystal display device LCD according to a first exemplary embodiment. FIG. 2 is a view illustrating a pixel circuit of the liquid crystal display panel LCP of the first exemplary embodiment;

Liquid crystal display device LCD is an example of an image display device that displays a still image or a moving image. As illustrated in FIG. 1, liquid crystal display device LCD1 includes liquid crystal display panel LCP, liquid crystal display panel driving circuit PDC (source driver SDC, gate driver GDC), backlight BL, and image processor IPU.

Liquid crystal display panel LCP is disposed on a light emission side of backlight BL. Liquid crystal display panel LCP displays a color image or a monochrome image in image display region DSP. For example, a system for driving liquid crystal display panel LC1 is a transverse electric field system such as IPS or FFS. In liquid crystal display panel LCP, for example, voltage is controlled by a normally black system. However, the voltage control system is not limited to the normally black system.

As illustrated in FIGS. 1 and 2, liquid crystal display panel LCP includes a plurality of pixels PIX arranged in a matrix. Image display region DSP in which the image is displayed is constructed with the plurality of pixels PIX arranged in a matrix.

As illustrated in FIG. 2, thin film transistor TR is provided in each of the plurality of pixels PIX. Thin film transistor TR includes gate electrode G, source electrode S, and drain electrode D.

Pixel electrode PIT and common electrode MIT are provided in each of the plurality of pixels PIX. In the first exemplary embodiment, one pixel electrode PIT is provided in each pixel PIX. On the other hand, common electrode MIT is one planner electrode common to all pixels PIX in image display region DSP, and is formed over entire image display region DSP.

As illustrated in FIG. 2, a plurality of scanning lines (gate lines) GL extending in a row direction and a plurality of video signal lines (source lines) SL extending in a column direction orthogonal to the row direction are formed in liquid crystal display panel LCP.

The plurality of scanning lines GL are provided at a corresponding boundary between two pixels PIX adjacent to each other in the column direction. In the first exemplary embodiment, one scanning line GL is provided for each boundary between two pixels PIX adjacent to each other in the column direction.

Scanning line GL is connected to each transistor TR of pixel PIX arranged in the row direction. Specifically, scanning line GL is connected to gate electrode G of each transistor TR in pixel PIX arranged in the row direction.

The plurality of video signal lines SL are provided at a corresponding boundary between two pixels PIX adjacent to each other in the row direction. In the first exemplary embodiment, one video signal lines SL is provided at each boundary between two pixels PIX adjacent to each other in the row direction.

Video signal line SL is connected to transistor TR of pixel PIX arranged in the column direction. Specifically, video signal line SL is connected to drain electrode D of each transistor TR in pixel PIX arranged in the column direction. That is, in the first exemplary embodiment, video signal line SL is a drain line.

In each pixel PIX, source electrode S of transistor TR is connected to pixel electrode PIT.

As illustrated in FIG. 1, liquid crystal display panel driving circuit PDC is connected to liquid crystal display panel LCP in order to display the image corresponding to an input video signal. Liquid crystal display panel driving circuit PDC includes source driver SDC and gate driver GDC. For example, source driver SDC and gate driver GDC are driver ICs (IC packages), and are mounted on a printed wiring board. The printed wiring board on which source driver SDC is mounted and the printed wiring board on which gate driver GDC is mounted are connected to liquid crystal display panel LCP through a flexible wiring board such as a Flexible Flat Cable (FFC) or a Flexible Printed Cable (FPC).

As illustrated in FIG. 2, source driver SDC is connected to video signal line SL of liquid crystal display panel LCP. In response to selection of scanning line GL by gate driver GDC, source driver SDC supplies, to video signal line SL, voltage (data voltage) corresponding to the video signal input from image processor IPU.

Gate driver GDC is connected to scanning line GL. Gate driver GDC selects pixel PIX in which the video signal is written according to a timing signal input from image processor IPU, and supplies the voltage (gate-on voltage) turning on transistor TR of selected pixel PIX to scanning line GL. Consequently, the data voltage is supplied to pixel electrode PIT of selected pixel PIX through transistor TR. A common voltage is supplied from a common driver (not illustrated) to common electrode MIT.

In this way, when the gate-on voltage is supplied from gate driver GDC to the scanning line GL, transistor TR of selected pixel PIX is turned on, and the data voltage is supplied from video signal line SL connected to transistor TR to pixel electrode PIT. An electric field is generated in a liquid crystal layer due to a difference between the data voltage supplied to pixel electrode PIT and the common voltage supplied to common electrode MIT. An alignment state of liquid crystal molecules of the liquid crystal layer in each pixel PIX is changed by the electric field, and transmittance of light of backlight BL passing through liquid crystal display panel LCP is controlled in each pixel PIX. Consequently, the desired image is displayed in the display region (pixel region) of liquid crystal display panel LCP.

As illustrated in FIG. 1, backlight BL is disposed on a back side of liquid crystal display panel LCP, and emits the light toward liquid crystal display panel LCP. In the first exemplary embodiment, backlight BL is a Light Emitting Diode (LED) backlight in which an LED is used as a light source. However, backlight BL is not limited to the LED backlight. Backlight BL is a direct under type LED backlight in which LEDs are two-dimensionally arranged on a substrate so as to face liquid crystal display panel LCP. However, backlight BL may be an edge type LED backlight. Backlight BL is a surface-emitting unit that emits planar, uniform scattered light (diffused light). In this case, backlight BL may include an optical member, such as a diffuser (a diffusion sheet), which diffuses the light emitted from the light source.

Image processor IPU is a control device including an arithmetic processing circuit such as a CPU and a memory such as a ROM and a RAM. Image data is input to image processor IPU in order to display the image on liquid crystal display panel LCP. A CPU reads and executes a program stored in the memory, whereby the image processor IPU performs various pieces of processing. Specifically, image processor IPU performs various pieces of image signal processing such as color adjustment on the video data input from an external system (not illustrated) to generate the video signal indicating a gray scale value of each pixel PIX and the timing signal indicating timing of writing the video signal in each pixel PIX, and outputs the video signal to source driver SDC while outputting the timing signal to gate driver GDC.

Figure 3:
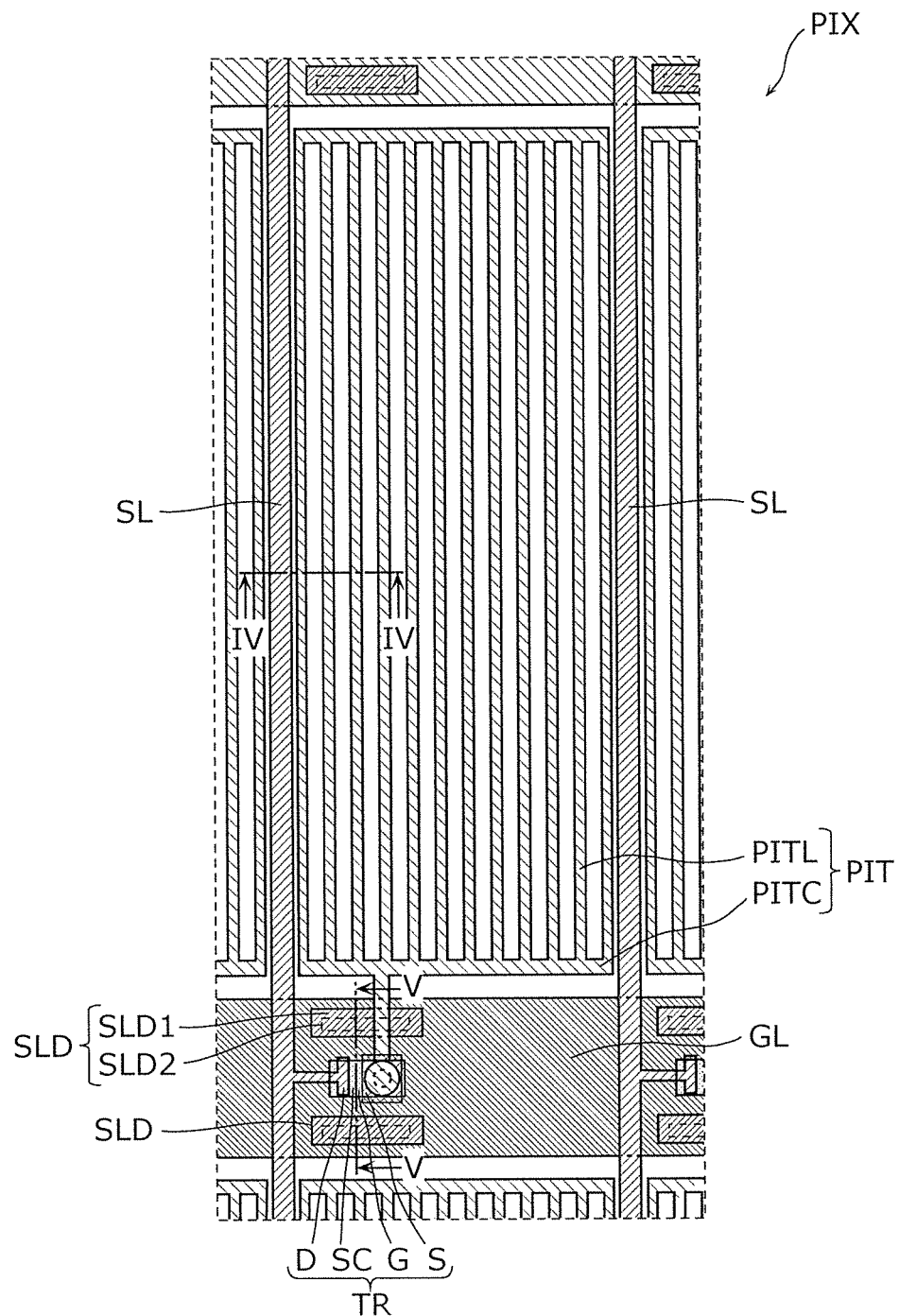
FIG. 3 is a plan view illustrating a configuration of a pixel in the liquid crystal display panel of the first exemplary embodiment.
Figure 4:
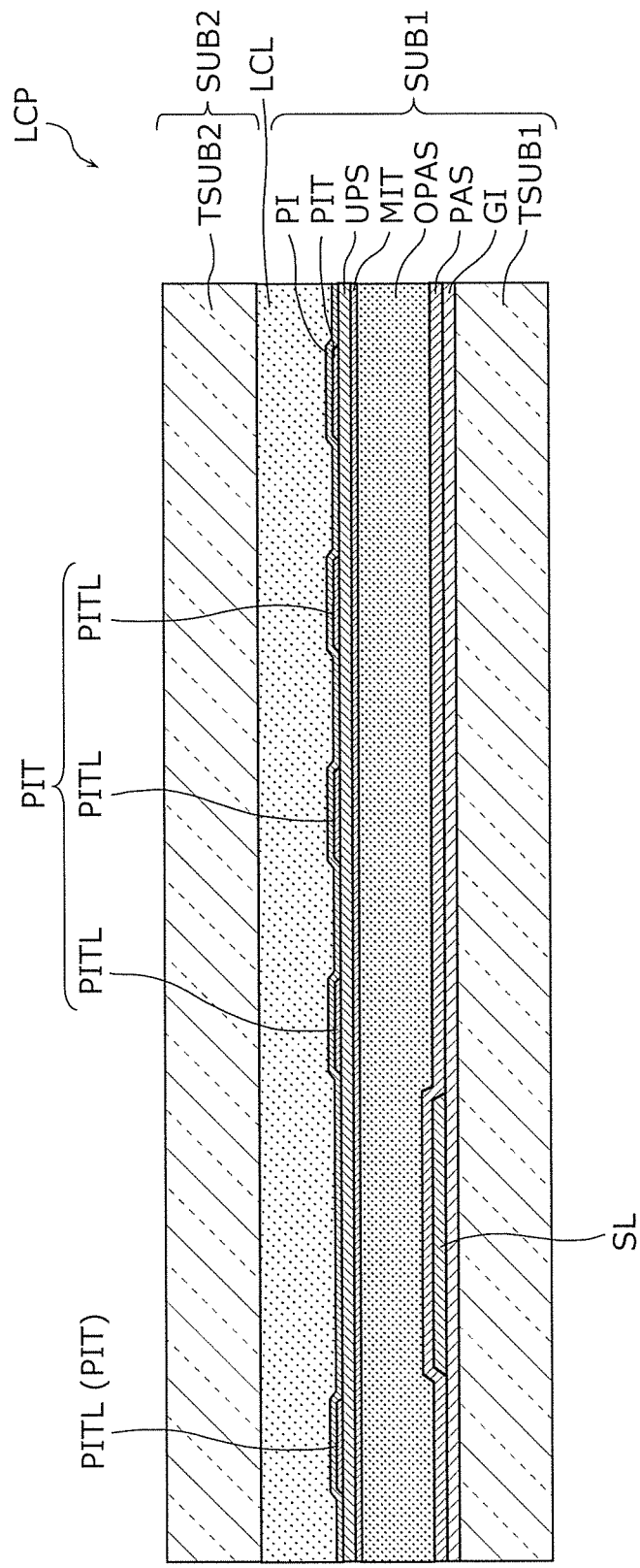
FIG. 4 is a sectional view taken along a line IV-IV in FIG. 3 in the liquid crystal display panel of the first exemplary embodiment.
Figure 5:
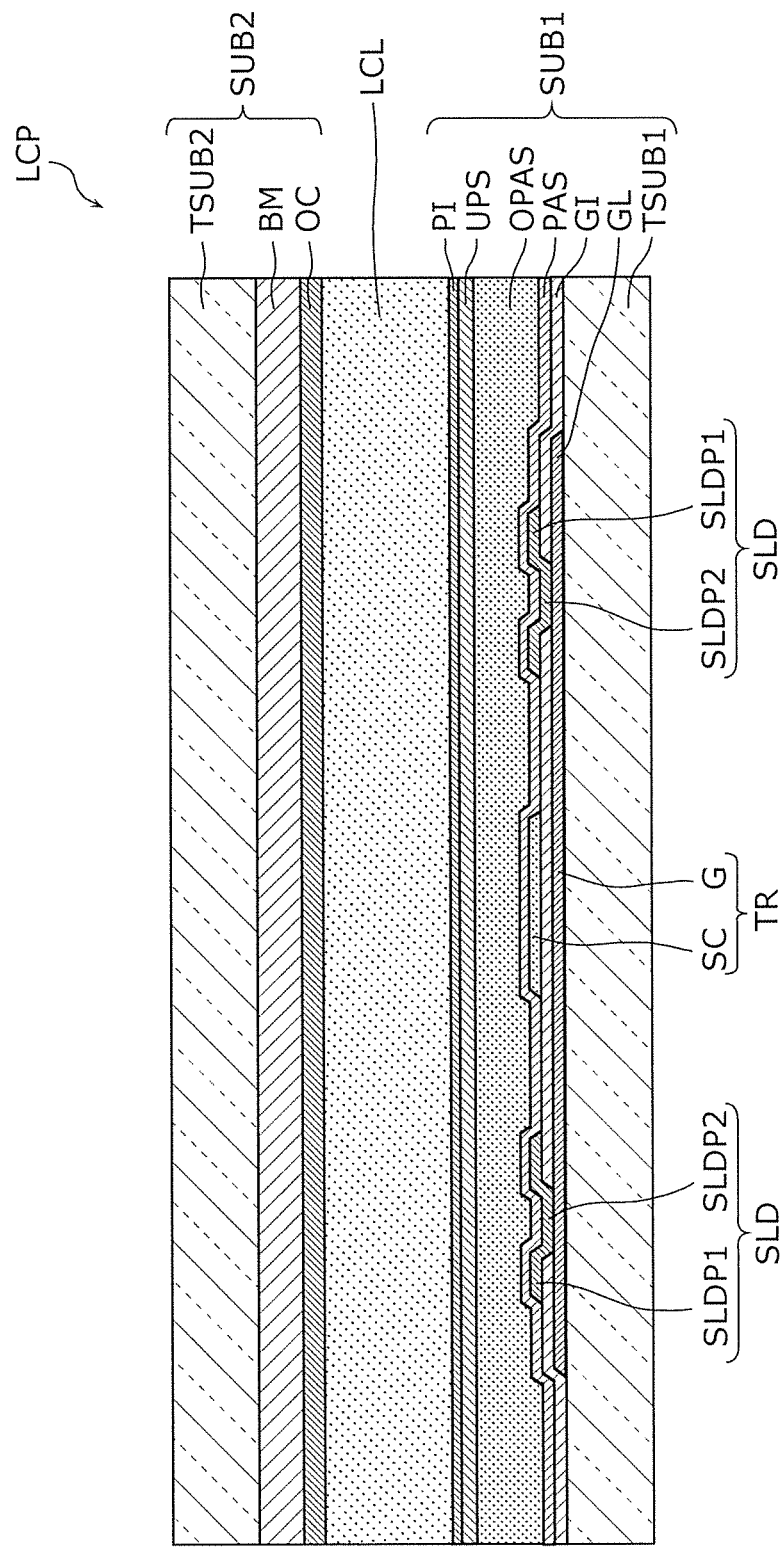
FIG. 5 is a sectional view taken along a line V-V in FIG. 3 in the liquid crystal display panel of the first exemplary embodiment.

A specific structure of liquid crystal display panel LCP will be described with reference to FIGS. 3 to 5. FIG. 3 is a plan view illustrating a configuration of pixel PIX in liquid crystal display panel LCP of the first exemplary embodiment. FIG. 4 is a sectional view taken along a line IV-IV in FIG. 3 in liquid crystal display panel LCP. FIG. 5 is a sectional view taken along a line V-V in FIG. 3 in liquid crystal display panel LCP.

As illustrated in FIG. 3, each pixel PIX is a region surrounded by scanning line GL extending in the row direction and video signal line SL extending in the column direction. Pixel electrode PIT is provided in each pixel PIX.

As illustrated in FIG. 3, pixel electrode PIT includes a plurality of line electrodes PITL extending in the column direction. Ends in a longitudinal direction of each of the plurality of line electrodes PITL are connected by connection electrode PITC extending along the row direction in a vicinity of scanning line GL. In each pixel electrode PIT, all line electrodes PITL are formed in parallel to each other with the same width and the same interval. In the first exemplary embodiment, each line electrode PITL is linearly formed, but may be formed into a substantial D shape having a bent portion in a central portion.

As illustrated in FIGS. 4 and 5, liquid crystal display panel LCP includes first substrate SUB1, second substrate SUB2 opposed to first substrate SUB1, and liquid crystal layer LCL disposed between first substrate SUB1 and second substrate SUB2. In the first exemplary embodiment, first substrate SUB1 is located on the side of backlight BL, and second substrate SUB2 is located on the observer side. Liquid crystal layer LCL is sealed between first substrate SUB1 and second substrate SUB2.

First substrate SUB1 is a TFT substrate including the TFT as thin film transistor TR. Not only thin film transistor TR but also various wirings such as video signal line SL and scanning line GL, an interlayer insulator that insulates these wirings, pixel electrode PIT, common electrode MIT, and alignment film PI are provided in first substrate SUB1. These are formed on first transparent base material TSUB1. For example, first transparent base material TSUB1 is a transparent substrate such as a glass substrate.

Thin film transistor TR formed on first transparent base material TSUB1 includes gate electrode G, source electrode S, drain electrode D, and semiconductor layer SC constituting a channel layer. As illustrated in FIG. 5, thin film transistor TR is a TFT having a bottom gate structure, and is constructed with gate electrode G formed on first transparent base material TSUB1, gate insulating layer GI formed on gate electrode G, and semiconductor layer SC formed above gate electrode G with gate insulating layer GI interposed between semiconductor layer SC and gate electrode G.

In the first exemplary embodiment, gate electrode G is a part of scanning line GL, and semiconductor layer SC is formed on scanning line GL with gate insulating layer GI interposed between semiconductor layer SC and scanning line GL. Source electrode S and drain electrode D are formed on semiconductor layer SC.

Gate electrode G, source electrode S, and drain electrode D are made of a conductive material such as a metal material. Gate electrode G is made of a metal film having a two-layer structure of, for example, a lower molybdenum film and an upper copper film. Source electrode S and drain electrode D are made of a metal film having a two-layer structure of, for example, a lower molybdenum film and an upper copper film. A metal film is deposited by sputtering or the like and patterned by photolithography method and wet etching, whereby gate electrode G, source electrode S, and drain electrode D can be formed into a predetermined shape. In the first exemplary embodiment, source electrode S and drain electrode D are formed in the same layer, so that source electrode S and drain electrode D are formed by simultaneously patterning the same metal film.

Semiconductor layer SC is made of amorphous silicon. Semiconductor layer SC is made of a semiconductor film having a two-layer structure of, for example, an i-amorphous silicon film as a lower layer and an n-amorphous silicon film as an upper layer. In this case, an n-amorphous silicon film and an i-amorphous silicon film are successively deposited by plasma CVD to form a laminated film, and the laminated film is patterned by photolithography and wet etching patterning, which allows the formation of the semiconductor layer SC having a predetermined shape.

Gate insulating layer GI is made of an insulating material. For example, gate insulating layer GI is made of a silicon nitride film (for example, 390 nm). Gate insulating layer GI can be deposited by plasma CVD.

Gate electrode G, source electrode S, drain electrode D, semiconductor layer SC, and gate insulating layer GI are not limited to these materials. For example, the material for semiconductor layer SC is not limited to amorphous silicon, but polysilicon such as low-temperature polysilicon or an In—Ga—Zn—O-based oxide semiconductor may be used as semiconductor layer SC. Gate electrode G, source electrode S, drain electrode D, and semiconductor layer SC are not limited to the two-layer structure, but may be constructed with a single layer or at least three layers. Gate insulating layer GI is not limited to the single layer, but may be constructed with at least two layers.

As illustrated in FIGS. 3 to 5, scanning line GL and video signal line SL are formed on first substrate SUB1. Scanning line GL is formed in the same layer as gate electrode G. That is, scanning line GL and gate electrode G are formed by patterning the same metal film. On the other hand, video signal line SL is formed in the same layer as source electrode S and drain electrode D. That is, video signal line SL, source electrode S, and drain electrode D are formed by simultaneously patterning the same metal film. As illustrated in FIG. 3, in the first exemplary embodiment, drain electrode D of thin film transistor TR is connected to video signal line SL, and source electrode S of thin film transistor TR is connected to pixel electrode PIT.

As illustrated in FIGS. 3 and 5, light shielding body SLD is provided on first substrate SUB1. Light shielding body SLD is provided beside semiconductor layer SC, and shields light traveling toward semiconductor layer SC of thin film transistor TR. Light shielding body SLD has a guard structure that guards semiconductor layer SC by shielding the light traveling toward semiconductor layer SC.

Light shielding body SLD is formed in the same layer as at least one of source electrode S and drain electrode D. In the first exemplary embodiment, source electrode S and drain electrode D are formed in the same layer, so that light shielding body SLD is formed in the same layer as both source electrode S and drain electrode D. Thus, light shielding body SLD is made of the same material as source electrode S and drain electrode D. In the first exemplary embodiment, for example, light shielding body SLD, source electrode S and drain electrode D are formed by patterning the same metal film. That is, light shielding body SLD is the same metal film as source electrode S and drain electrode D, and is a reflection film that shields the light by reflecting the light incident on light shielding body SLD. Specifically, light shielding body SLD is made of a metal film having a two-layer structure of, for example, a lower molybdenum film (for example, 20 nm) and an upper copper film (for example, 300 nm). Light shielding body SLD, source electrode S, and drain electrode D are formed separately from one another.

As illustrated in FIG. 5, light shielding body SLD is provided above scanning line GL. Specifically, light shielding body SLD is formed on gate insulating layer GI laminated on scanning line GL. Light shielding body SLD and scanning line GL are connected to each other through contact hole CH made in gate insulating layer GI. That is, although light shielding body SLD is not electrically connected to source electrode S and drain electrode D, light shielding body SLD is electrically connected to scanning line GL. Contact hole CH is a through-hole made in gate insulating layer GI by photolithography and etching.

In the first exemplary embodiment, light shielding body SLD includes first light shielding unit SLDP1 that is a portion located above gate insulating layer GI and second light shielding unit SLDP2 that is a portion located in contact hole CH.

First light shielding unit SLDP1 is formed into an eave shape so as to protrude in a horizontal direction from an upper portion of second light shielding unit SLDP2. First light shielding unit SLDP1 is a first light shielding film formed along a top surface of gate insulating layer GI, and has an upper wall surface (upper light shielding surface) along the top surface of gate insulating layer GI. That is, the upper wall surface of first light shielding unit SLDP1 contacts with the top surface of gate insulating layer GI.

Second light shielding unit SLDP2 is a connecting unit that connects first light shielding unit SLDP1 and scanning line GL, between which gate insulating layer GI is interposed. Second light shielding unit SLDP2 is a second light shielding film formed so as to bury contact hole CH, and has a sidewall surface (transverse light shielding surface) along an inside surface of contact hole CH. That is, the sidewall surface of second light shielding unit SLDP2 contacts with the inside surface of contact hole CH.

In the first exemplary embodiment, contact hole CH is made by isotropic etching, so that contact hole CH has a forward tapered shape in which an inner diameter gradually decreases from a top to a bottom. Thus, the inside surface of contact hole CH is an inclined surface. Consequently, the sidewall surface of second light shielding unit SLDP2 formed in contact hole CH also becomes the inclined surface.

A length (a protrusion amount in the horizontal direction from second light shielding unit SLDP2) of the upper wall surface of first light shielding unit SLDP1 in a width direction (column direction) of scanning line GL is longer than a length of the sidewall surface of second light shielding unit SLDP2. As illustrated in FIG. 3, in the first exemplary embodiment, first light shielding unit SLDP1 is formed so as to protrude in all directions from the upper portion of second light shielding unit SLDP2, and the upper wall surface of first light shielding unit SLDP1 is longer than the sidewall surface of second light shielding unit SLDP2 in all the directions.

As illustrated in FIG. 3, light shielding body SLD of the first exemplary embodiment is located between an end in the width direction of scanning line GL and semiconductor layer SC in planar view. Specifically, as illustrated in FIGS. 3 and 5, an outside leading end of first light shielding unit SLDP1 in the width direction of scanning line GL is located above scanning line GL. That is, the outside leading end of first light shielding unit SLDP1 in the width direction of scanning line GL exists at a position retracted from the end in the width direction of scanning line GL.

In the first exemplary embodiment, a pair of light shielding bodies SLD is provided, and semiconductor layer SC interposed between the pair of light shielding bodies SLD. The pair of light shielding bodies SLD are arranged in the width direction of scanning line GL. That is, semiconductor layer SC is located between the pair of light shielding bodies SLD.

In the first exemplary embodiment, semiconductor layer SC has an elongated shape extending in a longitudinal direction of scanning line GL (the row direction of pixel PIX), so that the pair of light shielding bodies SLD extends in the longitudinal direction of scanning line GL. Specifically, in the longitudinal direction of scanning line GL, each light shielding body SLD is longer than semiconductor layer SC. That is, the light shielding body SLD in the longitudinal direction of scanning line GL is longer than semiconductor layer SC in the longitudinal direction of scanning line GL.

Light shielding body SLD is covered with first insulator PAS. First insulator PAS is formed above first transparent base material TSUB1 so as to cover thin film transistor TR, scanning line GL, video signal line SL, and light shielding body SLD. Specifically, first insulator PAS is formed over the entire surface of gate insulating layer GI so as to cover a wiring layer including scanning line GL and gate electrode G, a wiring layer including video signal line SL, source electrode S, drain electrode D, and light shielding body SLD, and a layer including semiconductor layer SC. First insulator PAS is constructed with an inorganic insulator made of an inorganic material such as a silicon nitride film. For example, first insulator PAS that is an inorganic insulator can be deposited by plasma CVD.

Second insulator OPAS is formed so as to cover first insulator PAS. In the first exemplary embodiment, a thickness of second insulator OPAS is larger than a thickness of first insulator PAS. Specifically, the thickness of second insulator OPAS is greater than or equal to 10 times the thickness of first insulator PAS. Consequently, a distance in the thickness direction between the wiring such as scanning line GL and video signal line SL and common electrode MIT can be increased, so that the parasitic capacitance generated by the wiring such as scanning line GL and video signal line SL and common electrode MIT can be reduced. Additionally, by thickening second insulator OPAS, a difference in irregularity caused by forming transistor TR, scanning line GL, and video signal line SL, of the TFT layer can be reduced to planarize the TFT layer. Consequently, second insulator OPAS in which the surface is planarized can be formed, so that common electrode MIT immediately above second insulator OPAS can be formed into a planar shape.

In the first exemplary embodiment, second insulator OPAS is constructed with an organic insulator made of an organic material containing carbon. Second insulator OPAS that is the organic insulator can be formed by, for example, applying and hardening a liquid organic material. Consequently, second insulator OPAS can easily be thickened, so that the surface of second insulator OPAS can easily be planarized over all pixels PIX. That is, second insulator OPAS functions as a planarization layer.

A refractive index of second insulator OPAS laminated on first insulator PAS is smaller than a refractive index of first insulator PAS. For example, second insulator OPAS has the refractive index of 1.5, and first insulator PAS has the refractive index of 1.9. The refractive index of gate insulating layer GI laminated under first insulator PAS is equal to the refractive index of the first insulator PAS, and gate insulating layer GI has the refractive index of, for example, 1.5.

Common electrode MIT and pixel electrode PIT are formed on the first substrate SUB1. Specifically, common electrode MIT and pixel electrode PIT are laminated so as to be opposed to each other with a third insulator UPS interposed therebetween.

In the first exemplary embodiment, common electrode MIT is formed on second insulator OPAS. Third insulator UPS is formed so as to cover common electrode MIT, and pixel electrode PIT is formed into a predetermined shape on third insulator UPS. Common electrode MIT and pixel electrode PIT are transparent electrodes made of a transparent metal oxide such as Indium Tin Oxide (ITO). Third insulator UPS is made of an inorganic insulator such as a silicon nitride film. Third insulator UPS that is the inorganic insulator can be formed by, for example, a CVD method.

As described above, common electrode MIT is a planar solid electrode formed over all pixels PIX. Consequently, the wirings such as scanning line GL and video signal line SL are covered with common electrode MIT, so that the electric field generated by the wirings such as scanning line GL and video signal line SL can be shielded by common electrode MIT. That is, the electric field generated in the TFT layer can be shielded by common electrode MIT.

Common electrode MIT is a thin-film, planar, solid electrode, and an opening (not illustrated) extending along the row direction is formed on scanning line GL in common electrode MIT. A contact hole penetrating an insulating layer having a three-layer structure of first insulator PAS, second insulator OPAS, and third insulator UPS is made in the opening of common electrode MIT. Pixel electrode PIT is connected to source electrode S of thin film transistor TR through the contact hole. Light shielding body SLD is formed at a position overlapping the opening of common electrode MIT in planar view.

alignment film PI is formed on pixel electrode PIT. Alignment film PI is formed over all pixels PIX so as to cover pixel electrode PIT above first transparent base material TSUB1. Alignment film PI contacts with liquid crystal layer LCL, and controls an initial alignment angle of the liquid crystal molecules of liquid crystal layer LCL. In the first exemplary embodiment, alignment film PI is subjected to a rubbing treatment in order to align initial alignment angles of the liquid crystal molecules in a certain direction.

As illustrated in FIGS. 4 and 5, observer-side second substrate SUB2 is a counter substrate opposed to first substrate SUB1. Second substrate SUB2 includes second transparent base material TSUB2 and light shielding layer BM formed on second transparent base material TSUB2. Similarly to first transparent base material TSUB1, for example, second transparent base material TSUB2 is a transparent substrate such as a glass substrate.

Light shielding layer BM is a black layer. For example, light shielding layer BM is made of carbon black. Light shielding layer BM is formed on the surface on the side of liquid crystal layer LCL of second transparent base material TSUB2. In the first exemplary embodiment, light shielding layer BM is formed at each boundary between two pixels PIX adjacent to each other in the column direction. Specifically, a plurality of light shielding layers BM are formed so as to cover each scanning line GL on first substrate SUB1. That is, each light shielding layer BM overlaps each scanning line GL in planar view. Each light shielding layer BM has a stripe shape, and is formed into a line shape along the row direction with a constant width. The width of light shielding layer BM is larger than the width of scanning line GL, and scanning line GL is formed so as not to protrude from light shielding layer BM. This allows the light such as natural light to be shielded. Consequently, the degradation of the image quality due to reflection of the light such as natural light from the surfaces of lead line LDL and scanning line GL can be prevented.

As illustrated in FIG. 4, in the first exemplary embodiment, light shielding layer BM is not formed at a boundary between two pixels PIX adjacent to each other in the row direction, and video signal line SL is not covered with light shielding layer BM. However, light shielding layer BM may be formed so as to cover not only scanning line GL but also video signal line SL. That is, light shielding layer BM may be formed in a lattice shape.

In the case that liquid crystal display panel LCP displays the color image, second substrate SUB2 constitutes a color filter substrate including a color filter. In this case, for example, one of a red color filter, a blue color filter, and a green color filter is formed according to each pixel PIX. The color filter is formed in the region (that is, opening of light shielding layer BM) between light shielding layers BM. On the other hand, in the case that liquid crystal display panel LCP displays the monochrome image, the color filter is not formed on second substrate SUB2.

A pair of polarizing plates (not illustrated) is bonded to liquid crystal display panel LCP having the above configuration. For example, one of a pair of polarizing plates is formed on the outer surface of first substrate SUB 1, and the other of the pair of polarizing plates is formed on the outer surface of second substrate SUB 2. The pair of polarizing plates is disposed such that the polarization directions of polarizing plates are orthogonal to each other. A wave plate may be bonded to the pair of polarizing plates.

An action of liquid crystal display panel LCP of the first exemplary embodiment will be described below including circumstances leading to the present disclosure.

The thin film transistor is formed on the TFT substrate of the liquid crystal display panel in the liquid crystal display device. It is known that a threshold voltage (Vth) of the thin film transistor fluctuates when the light is incident on the semiconductor layer (channel layer) of the thin film transistor.

In the case that the semiconductor layer of the thin film transistor is made of amorphous silicon, because amorphous silicon has a characteristic of absorbing the light, not only a threshold voltage of the thin film transistor fluctuates but also a photoconductive phenomenon is generated to increase an off-leak current increases when the light is incident on the semiconductor layer.

As described above, when the light is incident on the semiconductor layer of the thin film transistor, there is a problem in that the TFT characteristic is changed to degrade the image quality of the liquid crystal display device.

The light from the backlight in the liquid crystal display device, the light (natural light) entering from the outside of the liquid crystal display device, and the light (scattered light) scattered by the liquid crystal layer are conceivable as the light incident on the semiconductor layer of the thin film transistor of the liquid crystal display panel.

For this reason, in the conventional liquid crystal display panel, there has been proposed a technique of shielding the light to be incident on the semiconductor layer of the thin film transistor by forming the semiconductor layer of the thin film transistor on the metal film such as the scanning line or by forming the light shielding film on the semiconductor layer of the thin film transistor.

However, even if such a technique is used, the fluctuation of the TFT characteristic of the thin film transistor cannot sufficiently be prevented.

The inventor of the present disclosure has studied various causes of the fluctuation of the TFT characteristic of the thin film transistor except for the light, but failed to sufficiently prevent the fluctuation of the TFT characteristic of the thin film transistor.

As a result of further study, the inventor of the present disclosure has come to an idea that the light to be incident on the semiconductor layer of the thin film transistor is not sufficiently shielded, and studied a path of the light incident on the semiconductor layer of the thin film transistor.

Figure 6:
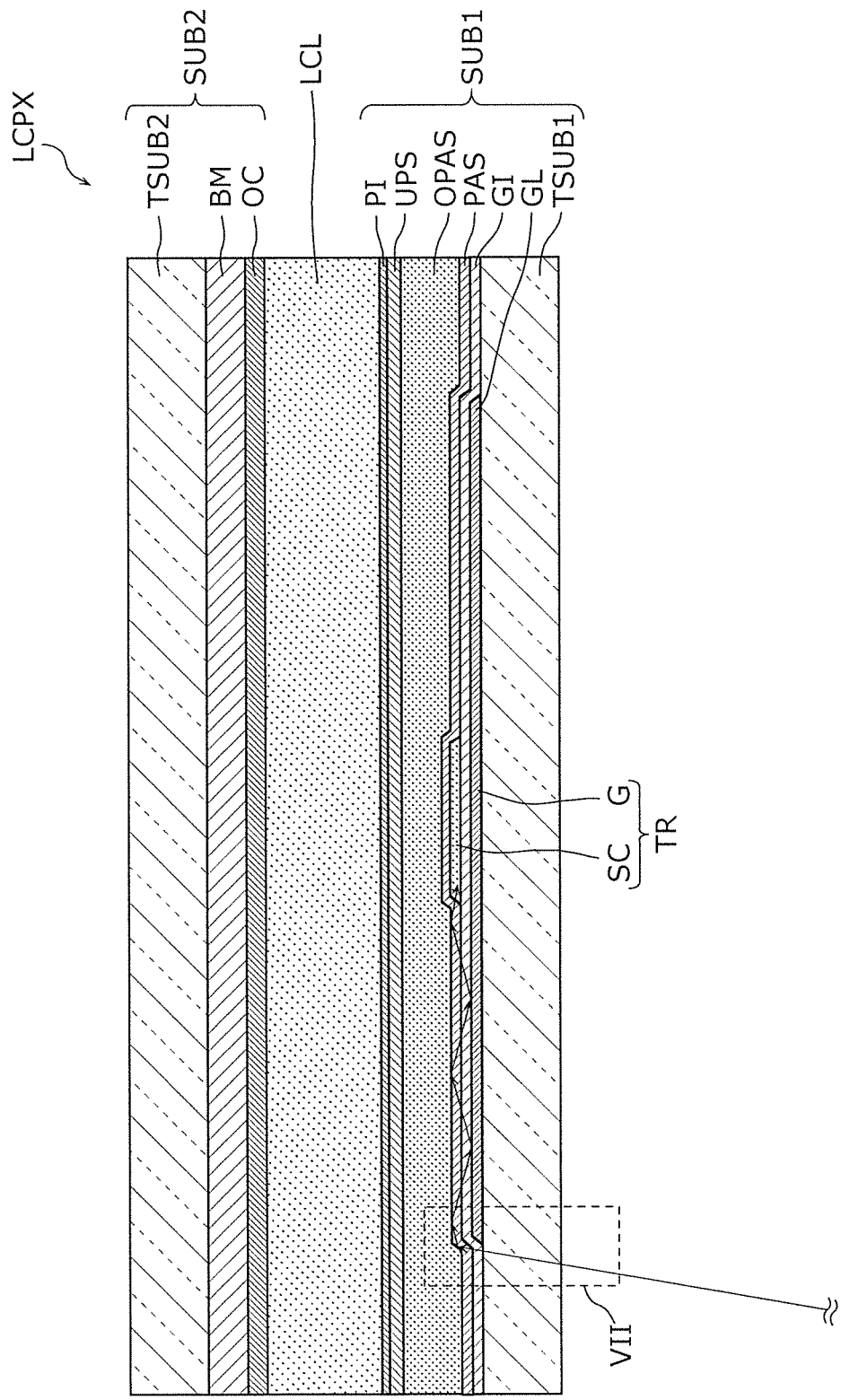
FIG. 6 is a sectional view illustrating a configuration of a liquid crystal display device according to a related art.
Figure 7:
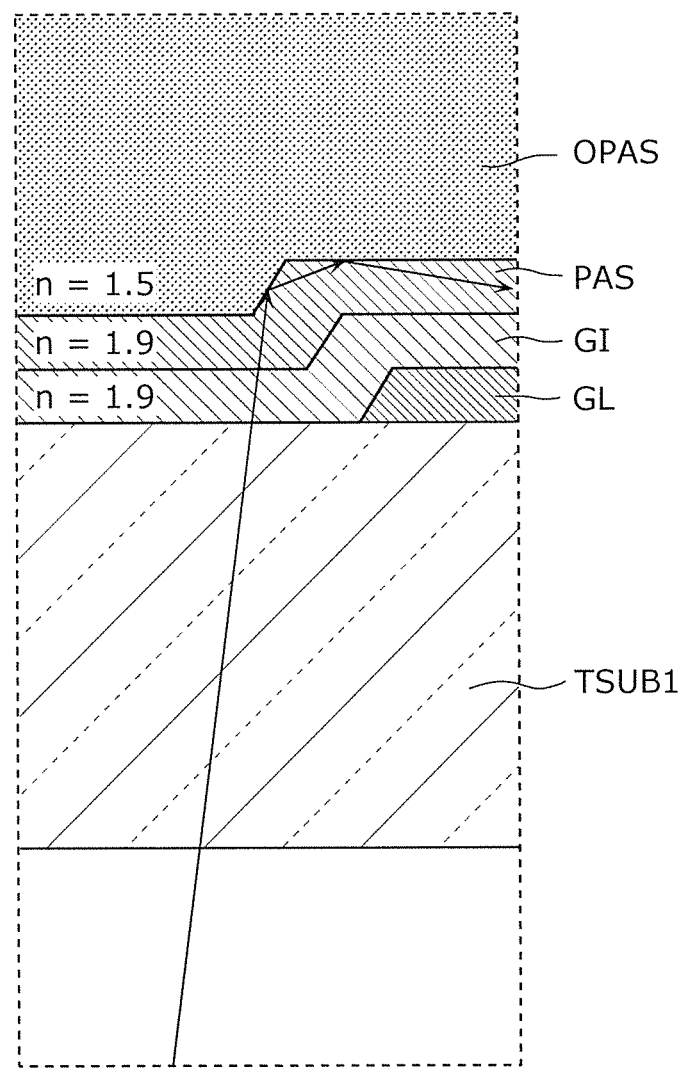
FIG. 7 is an enlarged view illustrating a region VII surrounded by a broken line in FIG. 6.

As a result, it was found that part of the light (such as the light of the backlight) incident from the back surface of the liquid crystal display panel is incident on the semiconductor layer of the thin film transistor due to the shape of the end in the width direction of scanning line GL. This point will be described below with reference to FIGS. 6 and 7. FIG. 6 is a sectional view illustrating a configuration of conventional liquid crystal display panel LCPX. FIG. 7 is an enlarged view illustrating region VII surrounded by a broken line in FIG. 6.

Conventional liquid crystal display panel LCPX in FIG. 6 has a configuration in which light shielding body SLD is not provided unlike the liquid crystal display panel LCP of the first exemplary embodiment in FIG. 5.

When scanning line GL is formed into a predetermined shape, the metal film is patterned by photolithography and wet etching. At this point, the metal film is isotropically etched, so that the side surface at the end in the width direction of scanning line GL appears as the inclined surface (tapered surface) as illustrated in FIGS. 6 and 7. In this case, the inclination angle of the inclined surface at the end of scanning line GL varies depending on a type of the metal film or an etchant, but the inclination angle is, for example, about 45°.

When the side surface at the end of scanning line GL becomes an inclined surface, gate insulating layer GI covering the end of the scanning line GL in a stepwise manner also has the inclined surface above the end of scanning line GL. Similarly, first insulator PAS and second insulator OPAS sequentially laminated on gate insulating layer GI also have the inclined surface above the end of scanning lines GL. As a result, above the end of scanning lines GL, the boundary between gate insulating layer GI and first insulator PAS becomes the inclined surface, and the boundary between first insulator PAS and second insulator OPAS also becomes the inclined surface.

At this point, the refractive index of second insulator OPAS laminated on first insulator PAS is smaller than the refractive index of first insulator PAS. For this reason, as illustrated in FIG. 7, part of the light incident from the back surface of liquid crystal display panel LCPX is totally reflected at the inclined surface (inclined boundary) in the boundary between first insulator PAS and second insulator OPAS above the end of scanning line GL. As a result, part of the light incident from the back surface of liquid crystal display panel LCPX is totally reflected at the inclined boundary between first insulator PAS and second insulator OPAS. Then, as illustrated in FIG. 6, the light travels in gate insulating layer GI toward semiconductor layer SC of thin film transistor TR while repeating the metal reflection on the surface of scanning line GL that is the metal film and the total reflection at the boundary between first insulator PAS and second insulator OPAS, and the light reaches semiconductor layer SC.

As a result of intensive research by the inventor, it has been found that part of the light incident on liquid crystal display panel LCPX is totally reflected at the inclined boundary between first insulator PAS and second insulator OPAS, the incline boundary being formed due to the inclined surface at the end of scanning line GL, which allows the part of the light to be incident on semiconductor layer SC of thin film transistor TR.

The present disclosure has been made based on such findings, and the inventor of the present disclosure has found that light shielding body SLD that shields the light totally reflected at the inclined boundary between first insulator PAS and second insulator OPAS is provided using the metal film used to form source electrode S and drain electrode D.

Specifically, light shielding body SLD formed in the same layer as at least one of source electrode S and drain electrode D is formed above scanning line GL and beside semiconductor layer SC, and connected to scanning line GL through contact hole CH made in gate insulating layer GI.

Figure 8:
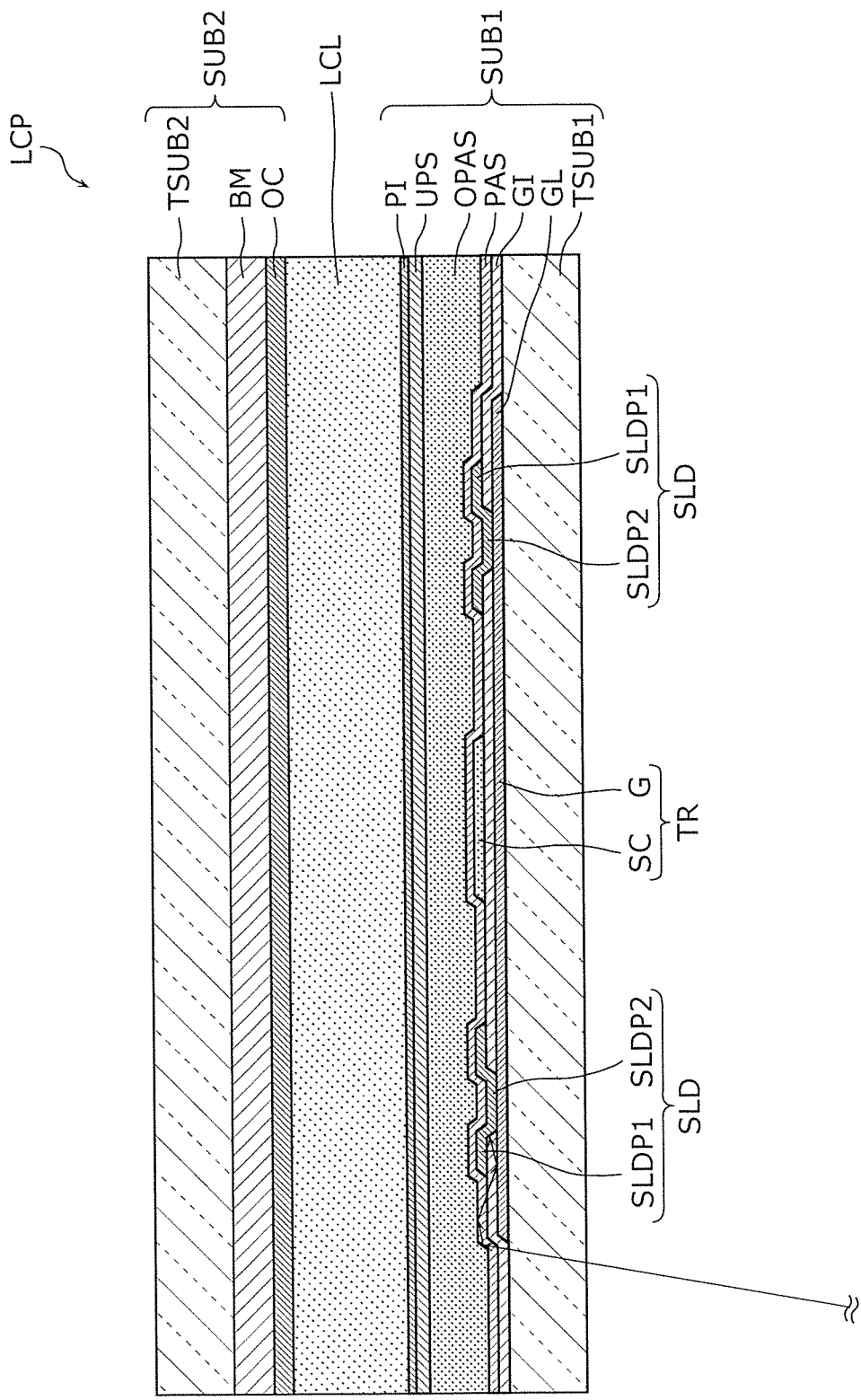
FIG. 8 is a view illustrating an example of an optical pass of light traveling toward a semiconductor layer of a thin film transistor in the liquid crystal display panel of the first exemplary embodiment.

With this configuration, as illustrated in FIG. 8, even if part of the light incident on liquid crystal display panel LCP travels in gate insulating layer GI due to the total reflection at the inclined boundary between first insulator PAS and second insulator OPAS, the inclined boundary being formed above the end of scanning line GL, the part of the light can be prevented from reaching semiconductor layer SC.

Specifically, light shielding body SLD and scanning line GL are connected to each other through contact hole CH made in gate insulating layer GI, so that light shielding body SLD exists in contact hole CH. That is, a light shielding wall constructed with light shielding body SLD is formed in gate insulating layer GI. Consequently, the light traveling in gate insulating layer GI toward semiconductor layer SC is blocked by the reflection at light shielding body SLD existing in contact hole CH. As a result, the light incident on liquid crystal display panel LCP can be prevented from being incident on semiconductor layer SC. Thus, the fluctuation of the threshold voltage of thin film transistor TR due to the light incident on semiconductor layer SC can be prevented. As a result, the degradation of the image quality of liquid crystal display panel LCP can be prevented.

In liquid crystal display panel LCP of the first exemplary embodiment, the light shielding body SLD is located between the end in the width direction of scanning line GL and semiconductor layer SC in planar view.

With this configuration, the light incident on liquid crystal display panel LCP from the side at the end in the width direction of scanning line GL can effectively be prevented from being incident on semiconductor layer SC of thin film transistor TR.

In particular, the side surface at the end in the width direction of scanning line GL is the inclined surface in liquid crystal display panel LCP of the present embodiment. The refractive index of second insulator OPAS is smaller than the refractive index of first insulator PAS.

Consequently, part of the light incident on liquid crystal display panel LCP is totally reflected at the boundary between first insulator PAS and second insulator OPAS, which are formed due to the side surface (inclined surface) at the end in the width direction of scanning line GL, and travels in gate insulating layer GI toward semiconductor layer SC. In liquid crystal display panel LCP of the first exemplary embodiment, light shielding body SLD exists in contact hole CH made in gate insulating layer GI, so that the totally-reflected light is blocked by the reflection at light shielding body SLD existing in contact hole CH. As a result, the light totally reflected at the inclined boundary between first insulator PAS and second insulator OPAS can effectively be prevented from being incident on semiconductor layer SC.

In the first exemplary embodiment, light shielding body SLD includes first light shielding unit SLDP1 located above gate insulating layer GI and second light shielding unit SLDP2 located in contact hole CH of gate insulating layer GI.

With this configuration, second light shielding unit SLDP2 in contact hole CH serves as a light shielding wall, so that the light traveling in gate insulating layer GI toward semiconductor layer SC is reflected and blocked by second light shielding unit SLDP2. Consequently, the light can effectively be prevented from being incident on semiconductor layer SC. First light shielding unit SLDP1 serves as an upper wall covering gate insulating layer GI, so that stray light can be prevented from leaking in the direction from gate insulating layer GI toward liquid crystal layer LCL. Thus, the degradation of the image quality of liquid crystal display panel LCP can further be prevented.

In particular, in the first exemplary embodiment, the outside leading end of first light shielding unit SLDP1 in the width direction of scanning line GL is located above scanning line GL.

With this configuration, the light totally reflected at the inclined boundary between first insulator PAS and second insulator OPAS travels in gate insulating layer GI between scanning line GL and first light shielding unit SLDP1 of light shielding body SLD, and the light traveling in gate insulating layer GI toward semiconductor layer SC can effectively be shielded by second light shielding unit SLDP2.

In the first exemplary embodiment, the upper wall surface of first light shielding unit SLDP1 in the width direction of scanning line GL is longer than the sidewall surface of second light shielding unit SLDP2.

With this configuration, the light that is totally reflected at the inclined boundary between first insulator PAS and second insulator OPAS to travel in gate insulating layer GI can be trapped in a space surrounded by the upper wall surface of first light shielding unit SLDP1 and the sidewall surface of second light shielding unit SLDP2. This enables the light totally reflected at the inclined boundary between first insulator PAS and second insulator OPAS to be prevented from becoming the stray light to travel in liquid crystal display panel LCP again. Thus, the degradation of the image quality of liquid crystal display panel LCP can further be prevented.

In the first exemplary embodiment, the inside surface of contact hole CH is the inclined surface.

With this configuration, the sidewall surface of second light shielding unit SLDP2 becomes the inclined surface, so that the light that is totally reflected at the inclined boundary between first insulator PAS and second insulator OPAS to travel in gate insulating layer GI can more efficiently be trapped in the space surrounded by the upper wall surface of first light shielding unit SLDP1 and the sidewall surface of second light shielding unit SLDP2.

In the first exemplary embodiment, a pair of light shielding bodies SLD is provided, and semiconductor layer SC is interposed between the pair of light shielding bodies SLD.

With this configuration, in the two sides where the pair of light shielding bodies SLD are formed in all sides of semiconductor layer SC, the light traveling toward semiconductor layer SC can be shielded by the pair of light shielding bodies SLD.

In the first exemplary embodiment, the pair of light shielding bodies SLD is aligned with the width direction of scanning line GL.

As described above, because the inclined surface is easily formed by etching at the end in the width direction of scanning line GL, the inclined surface is easily formed between first insulator PAS and second insulator OPAS above the both ends in the width direction of scanning line GL. For this reason, at each of both the ends in the width direction of scanning line GL, part of the light incident from the back surface of liquid crystal display panel LCP is totally reflected at the inclined boundary between first insulator PAS and second insulator OPAS to travel toward semiconductor layer SC. The light that is totally reflected at the inclined boundary between first insulator PAS and second insulator OPAS above each of both the ends in the width direction of scanning line GL to travel toward semiconductor layer SC can effectively be prevented by arranging the pair of light shielding bodies SLD in the width direction of scanning line GL.

In the first exemplary embodiment, semiconductor layer SC of thin film transistor TR is made of amorphous silicon.

As described above, because amorphous silicon has a characteristic of absorbing the light, not only the threshold voltage of thin film transistor TR fluctuates, but also the off-leakage current increases by the generation of the photoconductive phenomenon when the light is incident on semiconductor layer SC.

On the other hand, as described above, light shielding body SLD is provided in liquid crystal display panel LCP of the first exemplary embodiment, so that the light totally reflected at the inclined boundary between first insulator PAS and second insulator OPAS can be shielded by light shielding body SLD to prevented the light from being incident on semiconductor layer SC of thin film transistor TR. Consequently, not only the fluctuation of the threshold voltage of thin film transistor TR, but also the increase in off-leak current due to the generation of the photoconductive phenomenon can be prevented. As a result, the degradation of the image quality can effectively be prevented even in liquid crystal display panel LCP including thin film transistor TR in which the semiconductor layer is made of amorphous silicon as the channel layer.

Second Exemplary Embodiment

Figure 9:
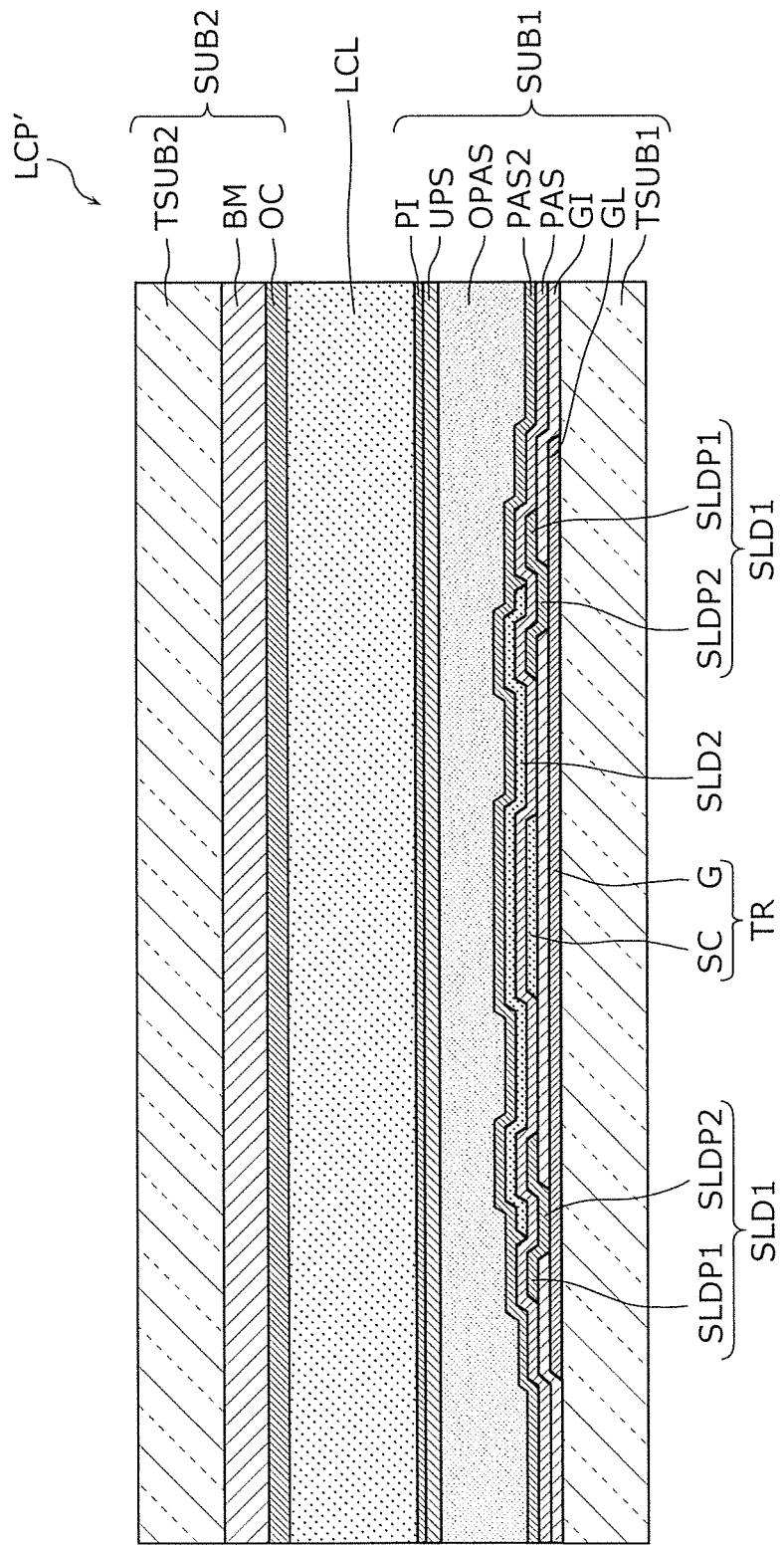
FIG. 9 is a sectional view of a liquid crystal display device according to a second exemplary embodiment.

Liquid crystal display panel LCP' according to a second exemplary embodiment will be described below with reference to FIG. 9. FIG. 9 is a sectional view illustrating liquid crystal display panel LCP' of the second exemplary embodiment.

As illustrated in FIG. 9, liquid crystal display panel LCP' of the second exemplary embodiment includes first light shielding body SLD1 and second light shielding body SLD2 as a guard structure that shields the light traveling toward semiconductor layer SC of thin film transistor TR.

First light shielding body SLD1 of the second exemplary embodiment is the same as light shielding body SLD of the first exemplary embodiment. That is, liquid crystal display panel LCP' of the second exemplary embodiment is configured such that second light shielding body SLD2 is further added to liquid crystal display panel LCP of the first exemplary embodiment.

Second light shielding body SLD2 is formed above semiconductor layer SC so as to cover semiconductor layer SC. Specifically, second light shielding body SLD2 is formed on first insulator PAS. That is, second light shielding body SLD2 is formed above semiconductor layer SC while first insulator PAS covering semiconductor layer SC is interposed between second light shielding body SLD2 and semiconductor layer SC.

In the second exemplary embodiment, second light shielding body SLD2 covers not only semiconductor layer SC but also a pair of first light shielding bodies SLD1. That is, second light shielding body SLD2 is formed from one to the other of the pair of first light shielding bodies SLD1. As illustrated in FIG. 9, second light shielding body SLD2 may overlap a part of the pair of first light shielding bodies SLD1 or a whole of the pair of first light shielding bodies SLD1 in planar view.

Similarly to the first exemplary embodiment, first light shielding body SLD1 shields the light by reflecting the visible light. However, second light shielding body SLD2 shields light by absorbing the visible light. Specifically, second light shielding body SLD2 is a light absorbing film made of a material absorbing the visible light. In the second exemplary embodiment, second light shielding body SLD2 is made of amorphous silicon.

In the second exemplary embodiment, interlayer insulator PAS2 is provided on first insulator PAS so as to cover second light shielding body SLD2, and second insulator OPAS is formed on interlayer insulator PAS2. Interlayer insulator PAS2 is constructed with an inorganic insulator (for example, 300 nm) made of an inorganic material such as a silicon nitride film, and can be formed by plasma CVD. Interlayer insulator PAS2 may not be provided. That is, second insulator OPAS may directly be laminated on second light shielding body SLD2.

As described above, according to liquid crystal display panel LCP' of the second exemplary embodiment, similarly to liquid crystal display panel LCP of the first exemplary embodiment, first light shielding body SLD1 formed in the same layer as at least one of source electrode S and drain electrode D is formed above scanning line GL and beside semiconductor layer SC, and connected to scanning line GL through contact hole CH made in gate insulating layer GI.

With this configuration, the light that is totally reflected at the inclined boundary between first insulator PAS and second insulator OPAS to travel in gate insulating layer GI toward semiconductor layer SC can be shielded by light shielding body SLD.

Additionally, in liquid crystal display panel LCP' of the second exemplary embodiment, second light shielding body SLD2 is formed so as to cover semiconductor layer SC.

With this configuration, the light traveling from above semiconductor layer SC toward semiconductor layer SC can be shielded by second light shielding body SLD2.

As described above, in the second exemplary embodiment, not only the light traveling from the side of semiconductor layer SC toward semiconductor layer SC can be prevented from being incident on semiconductor layer SC, but also the light traveling from above semiconductor layer SC toward semiconductor layer SC can be prevented from being incident on semiconductor layer SC. Thus, in liquid crystal display panel LCP' of the second exemplary embodiment, the fluctuation of the threshold voltage of thin film transistor TR due to the incidence of the light on semiconductor layer SC can further be prevented as compared with liquid crystal display panel LCP of the first exemplary embodiment. This can further prevent the degradation of the image quality of liquid crystal display panel LCP'.

In the second exemplary embodiment, second light shielding body SLD2 is made of amorphous silicon.

With this configuration, the light traveling from above semiconductor layer SC toward semiconductor layer SC can be shielded by absorbing the light using second light shielding body SLD2. Consequently, the light traveling from above semiconductor layer SC toward semiconductor layer SC can be prevented from being reflected or scattered by second light shielding body SLD2 to travel in liquid crystal display panel LCP' as the stray light again. Thus, the degradation of the image quality of liquid crystal display panel LCP' can further be prevented.

The material of second light shielding body SLD2 is not limited to amorphous silicon, but may be any light absorbing film, such as carbon black and color resist, which absorbs the light. Second light shielding body SLD2 is not limited to one that absorbs the light, but may be one that reflects the light similarly to first light shielding body SLD1.

(Modifications)

The liquid crystal display panel and the liquid crystal display device of the present disclosure are described above based on the first and second exemplary embodiments, but the present disclosure is not limited to the first and second exemplary embodiments.

Figure 10:
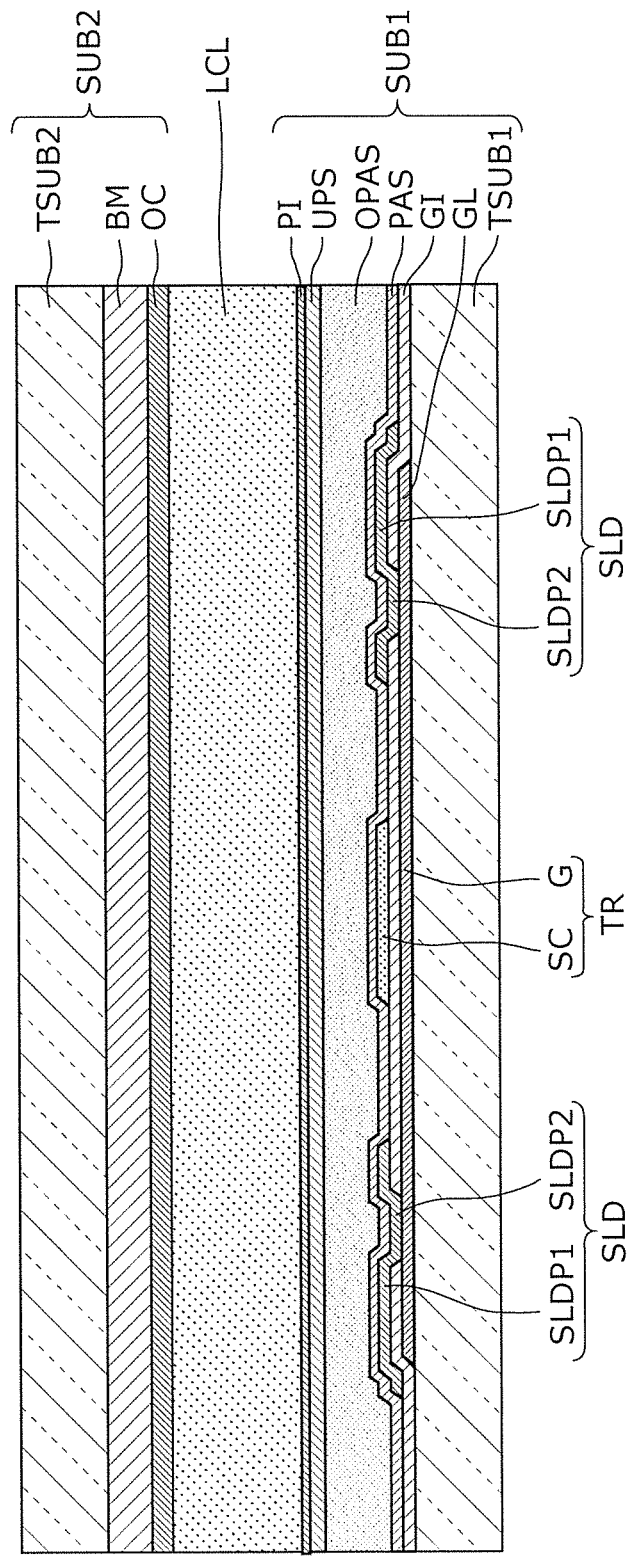
FIG. 10 is a sectional view of a liquid crystal display device according to a first modification.

For example, in light shielding body SLD of the first exemplary embodiment, the outside leading end of first light shielding unit SLDP1 in the width direction of scanning line GL is located above scanning line GL. However, the present disclosure is not limited to this configuration. For example, as illustrated in FIG. 10, first light shielding unit SLDP1 may extend to a position beyond the end in the width direction of scanning line GL. That is, the outside leading end of first light shielding unit SLDP1 in the width direction of scanning line GL may exist at a position outside an end edge in the width direction of scanning line GL. With this configuration, not only the light that is totally reflected at the inclined interface between the first insulator PAS and the second insulator OPAS to travel in gate insulating layer GI, but also the light traveling in gate insulating layer GI through other paths can be shielded.

Figure 11:
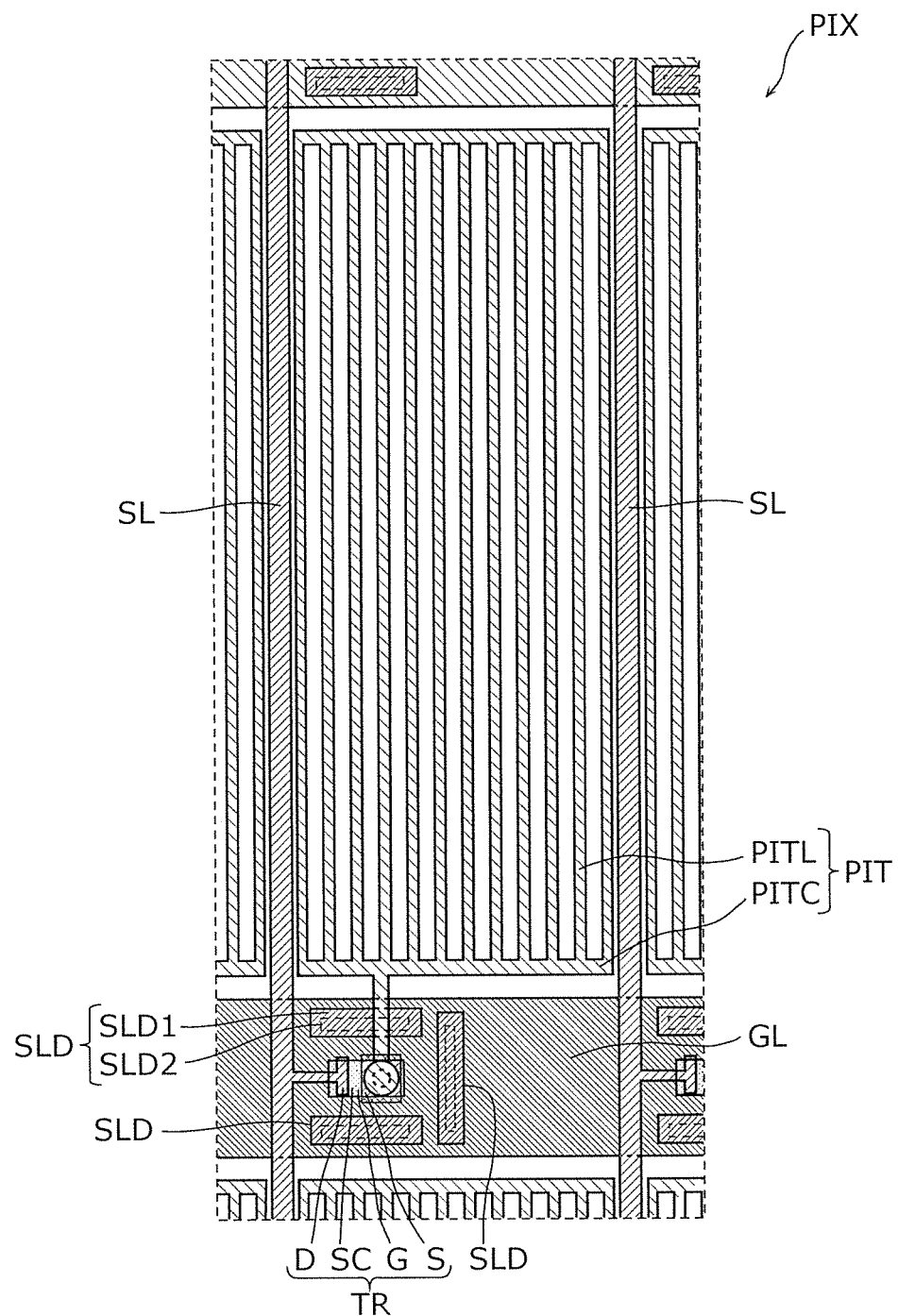
FIG. 11 is a plan view illustrating a layout of pixels of a liquid crystal display device according to a second modification.
Figure 12:
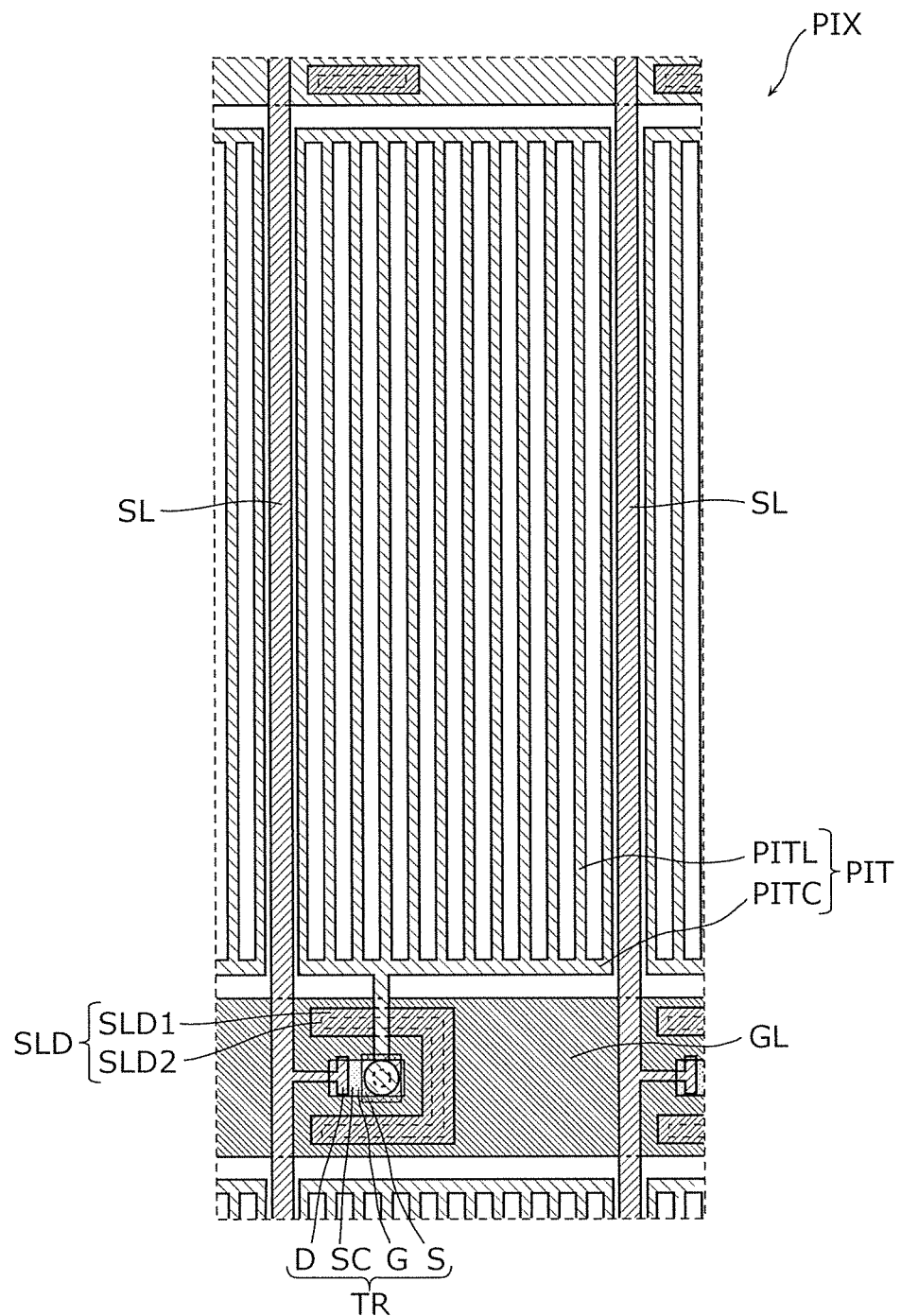
FIG. 12 is a plan view illustrating a layout of pixels of a liquid crystal display device according to a third modification.

In the first exemplary embodiment, only two light shielding bodies SLD are provided so as to be opposed to each of the sides (in FIG. 3, two long sides of semiconductor layer SC) in the width direction of scanning line GL in semiconductor layer SC. However, the present disclosure is not limited to this configuration. For example, as illustrated in FIG. 11, light shielding body SLD may be provided so as to surround semiconductor layer SC in planar view. Specifically, three light shielding bodies SLD may be provided by two sides in the column direction of semiconductor layer SC and one of two sides (in FIG. 11, two short sides of semiconductor layer SC) in the row direction of semiconductor layer SC. Light shielding body SLD is not formed while separated into a plurality of pieces, but may be one light shielding body SLD that is integrally formed so as to surround semiconductor layer SC as illustrated in FIG. 12. In FIG. 12, light shielding body SLD has a substantial U shape in planar view. However, the present disclosure is not limited to this configuration. In this way, light shielding body SLD is provided on not only the side in the column direction of the semiconductor layer SC but also the side in the row direction, which allows the light going around to the side in the row direction of the semiconductor layer SC in the light incident on liquid crystal display panel LCP from the side at the end in the width direction (column direction) of scanning line GL to be prevented from being incident on semiconductor layer SC.

In the above exemplary embodiments, the plurality of line electrodes PITL in pixel electrode PIT are connected by two connection electrodes PITC. However, the connection electrode PITC on the side far from transistor TR in pixel PIX may not be provided. In this case, pixel electrode PIT becomes the comb-shaped electrode constructed with the plurality of line electrodes PITL.

In the above exemplary embodiments, video signal line SL is connected to drain electrode D of transistor TR, and pixel electrode PIT is connected to source electrode S of transistor TR. However, the present disclosure is not limited to this configuration. For example, video signal line SL may be connected to source electrode S of transistor TR, and pixel electrode PIT may be connected to drain electrode D of transistor TR.

In the above exemplary embodiments, the plurality of line electrodes PITL of pixel electrode PIT extend along the column direction. However, the present disclosure is not limited to this configuration. That is, a part or all of the plurality of line electrodes PITL may extend along the row direction. In this case, the plurality of line electrodes PITL are not limited to the case that the plurality of line electrodes PITL extend in parallel to the row direction, but the plurality of line electrodes PITL may extend obliquely with respect to the row direction, or may be bent into a substantial U-shape.

Those skilled in the art will readily appreciate that many modifications are possible in the above exemplary embodiment and variations without materially departing from the novel teachings and advantages of the present disclosure. Accordingly, all such modifications are intended to be included within the scope of the present disclosure.

What is claimed is:

1. A liquid crystal display panel having a plurality of pixels arranged in a matrix comprising:
    a thin film transistor provided in one of the plurality of pixels, the thin film transistor including: a gate electrode,
        a source electrode,
        a drain electrode, and
        a semiconductor layer;
    a scanning line formed in a layer identical to that of the gate electrode and electrically connected to the gate electrode;
    a first light shielding body formed in a layer identical to that of at least one of the source electrode and the drain electrode;
    a common electrode in which an opening is formed on the scanning line in planar view,
        wherein the semiconductor layer is formed above the scanning line with an insulating layer interposed between the semiconductor layer and the scanning line,
        the first light shielding body is located above the scanning line and beside the semiconductor layer,
        the first light shielding body and the scanning line are connected to each other through a contact hole made in the insulating layer, and
        the first light shielding body overlaps the opening of the common electrode in planar view; and
    a video signal line electrically connected to the drain electrode, wherein
        the first light shielding body is disposed along a first side of the semiconductor layer, the first side is along the scanning line, and
        the first light shielding body is not disposed along the second side of the semiconductor layer, the second side is along the video signal line.

2. The liquid crystal display panel according to claim 1, wherein the first light shielding body is located between an end in a width direction of the scanning line and the semiconductor layer in planar view.

3. The liquid crystal display panel according to claim 1, wherein the first light shielding body includes a first light shielding unit located on the insulating layer and a second light shielding unit located in the contact hole.

4. The liquid crystal display panel according to claim 3, wherein an outside leading end of the first light shielding unit in the width direction of the scanning line is located on the scanning line in planar view.

5. The liquid crystal display panel according to claim 3, wherein
    the first light shielding unit includes an upper wall surface along a top surface of the insulating layer,
    the second light shielding unit includes a sidewall surface along an inside surface of the contact hole, and
    the upper wall surface in the width direction of the scanning line is longer than the sidewall surface in sectional view.

6. The liquid crystal display panel according to claim 3, wherein the inside surface of the contact hole is an inclined surface.

7. The liquid crystal display panel according to claim 1, wherein a pair of the first light shielding bodies is provided, and the semiconductor layer is interposed between the pair of first light shielding bodies in planar view.

8. The liquid crystal display panel according to claim 7, wherein the pair of first light shielding bodies is aligned with the width direction of the scanning line.

9. The liquid crystal display panel according to claim 1, wherein the first light shielding body surrounds the semiconductor layer in planar view.

10. The liquid crystal display panel according to claim 1, wherein a side surface at an end in a width direction of the scanning line is an inclined surface.

11. The liquid crystal display panel according to claim 10, further comprising:
    a first insulator covering the first light shielding body; and
    a second insulator covering the first insulator,
    wherein a refractive index of the second insulator is smaller than a refractive index of the first insulator.

12. The liquid crystal display panel according to claim 1, further comprising a second light shielding body covering the semiconductor layer.

13. The liquid crystal display panel according to claim 12, wherein the second light shielding body is made of amorphous silicon.

14. The liquid crystal display panel according to claim 1, wherein the semiconductor layer is made of amorphous silicon.

* * * * *